US012628644B2

(12) United States Patent (10) Patent No.: US 12,628,644 B2

Harada et al. (45) Date of Patent: May 12, 2026

(54) SEMICONDUCTOR DEVICE AND MODULE

(71) Applicant: Murata Manufacturing Co., Ltd., Nagaokakyo (JP)

(72) Inventors: Masatomi Harada, Nagaokakyo (JP); Takeshi Kagawa, Nagaokakyo (JP); Hiroshi Matsubara, Nagaokakyo (JP); Nobuyoshi Adachi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 863 days.

(21) Appl. No.: 17/859,245

(22) Filed: Jul. 7, 2022

(65) Prior Publication Data

US 2022/0336345 A1 Oct. 20, 2022

Related U.S. Application Data

(63) Continuation of application No. PCT/JP2021/001713, filed on Jan. 19, 2021.

(30) Foreign Application Priority Data

Jan. 20, 2020 (JP) ................................. 2020-006847

(51) Int. Cl.
*H10W 72/29* (2026.01)
*H01G 4/008* (2006.01)
(Continued)

(52) U.S. Cl.
CPC ............ *H10W 20/495* (2026.01); *H01G 4/08* (2013.01); *H10W 20/43* (2026.01); *H10W 74/00* (2026.01); *H01G 4/33* (2013.01)

(58) Field of Classification Search
CPC ... H01L 23/5222; H01L 23/28; H01L 23/528; H01L 21/78; H01L 24/06; H01L 24/03;
(Continued)

(56) References Cited

U.S. PATENT DOCUMENTS

| | | | |
|---|---|---|---|
| 5,717,233 | A | 2/1998 | Fujii et al. |
| 2007/0194404 | A1 | 8/2007 | Kuwajima et al. |

(Continued)

FOREIGN PATENT DOCUMENTS

| | | |
|---|---|---|
| JP | H06140275 A | 5/1994 |
| JP | 2007220985 A | 8/2007 |

(Continued)

OTHER PUBLICATIONS

Plasma etching: Yesterday, today, and tomorrow (Year: 2013).*

(Continued)

*Primary Examiner* — Zandra V Smith
*Assistant Examiner* — Daniel J Hibbert
(74) *Attorney, Agent, or Firm* — ArentFox Schiff LLP

(57) ABSTRACT

A semiconductor device having a semiconductor substrate with first and second main surfaces that face one another in a thickness direction, and a circuit layer disposed on the first main surface. The circuit layer has a first electrode layer on the semiconductor substrate, a dielectric layer on the first electrode layer, a second electrode layer on the dielectric layer, and first and second outer electrodes electrically connected to the first and second electrode layers, respectively. The semiconductor substrate has a first end-portion region in which the circuit layer is not provided on the semiconductor substrate and on the side of the first end surface. In the first end-portion region, a first exposed portion is provided that is exposed between the first main surface and the first end surface.

20 Claims, 7 Drawing Sheets

(51) Int. Cl.

| | |
|---|---|
| *H01G 4/012* | (2006.01) |
| *H01G 4/08* | (2006.01) |
| *H01G 4/228* | (2006.01) |
| *H10D 84/00* | (2025.01) |
| *H10P 54/00* | (2026.01) |
| *H10W 20/40* | (2026.01) |
| *H10W 20/43* | (2026.01) |
| *H10W 72/90* | (2026.01) |
| *H10W 74/00* | (2026.01) |
| *H01G 4/33* | (2006.01) |

(58) Field of Classification Search
CPC ......... H01L 24/05; H01L 24/13; H01L 24/16; H01L 2224/0346; H01L 2224/05572; H01L 2224/0603; H01L 2224/131; H01L 23/5223; H01L 2224/0401; H01L 2224/05559; H01L 2224/05571; H01L 2224/05573; H01L 2224/05582; H01L 2224/05611; H01L 2224/05624; H01L 2224/05644; H01L 2224/05647; H01L 2224/06505; H01L 2224/16227; H01L 2224/94; H01L 2924/10156; H01L 27/04; H01L 21/822; H01G 4/08; H01G 4/33; H01G 4/008; H01G 4/012; H01G 4/228; H10W 20/495; H10W 20/43; H10W 74/00; H10W 72/01935; H10W 72/0198; H10W 72/252; H10W 72/29; H10W 72/90; H10W 72/923; H10W 72/926; H10W 72/934; H10W 72/9415; H10W 72/952; H10W 72/957; H10W 90/724; H10W 20/496; H10D 84/00; H10D 84/038; H10P 54/00
See application file for complete search history.

(56) References Cited

U.S. PATENT DOCUMENTS

| | | | |
|---|---|---|---|
| 2014/0153155 A1* | 6/2014 | Fujii | H01G 4/012 361/301.4 |
| 2016/0204074 A1* | 7/2016 | Lin | H10D 30/60 257/76 |
| 2019/0096986 A1 | 3/2019 | Hsu et al. | |
| 2019/0311854 A1* | 10/2019 | Harada | H01G 4/33 |

FOREIGN PATENT DOCUMENTS

| | | | | |
|---|---|---|---|---|
| JP | 2008252011 A | | 10/2008 | |
| JP | 2009010114 A | | 1/2009 | |
| JP | 2016571914 A | * | 1/2016 | ............. H01L 23/13 |
| JP | WO2016121491 A1 | * | 10/2017 | ......... H10W 42/284 |
| KR | 1020080061154 A | | 7/2008 | |
| WO | WO-2018088265 A1 | * | 5/2018 | ............. H01G 4/012 |

OTHER PUBLICATIONS

Donnelly and Kornblit (J. Vac. Sci. Technol. A 31, 050825, 2013; Donnelly), Plasma etching: Yesterday, today, and tomorrow (Year: 2013).*

J. Vac. Sci. Technol. A 31, 050825, 2013, Donnelly) (Year: 2013).*

International Search Report in PCT/JP2021/001713, mailed Apr. 13, 2021, 4 pages.

* cited by examiner

FIG. 1
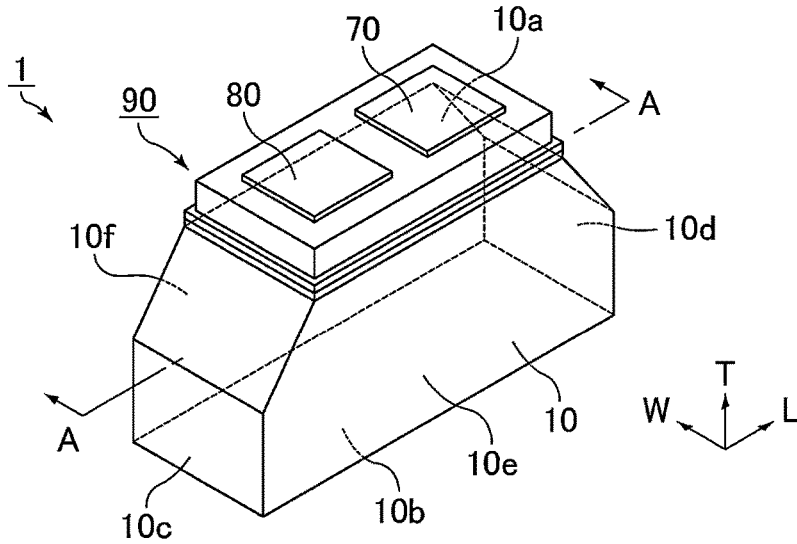
FIG. 2
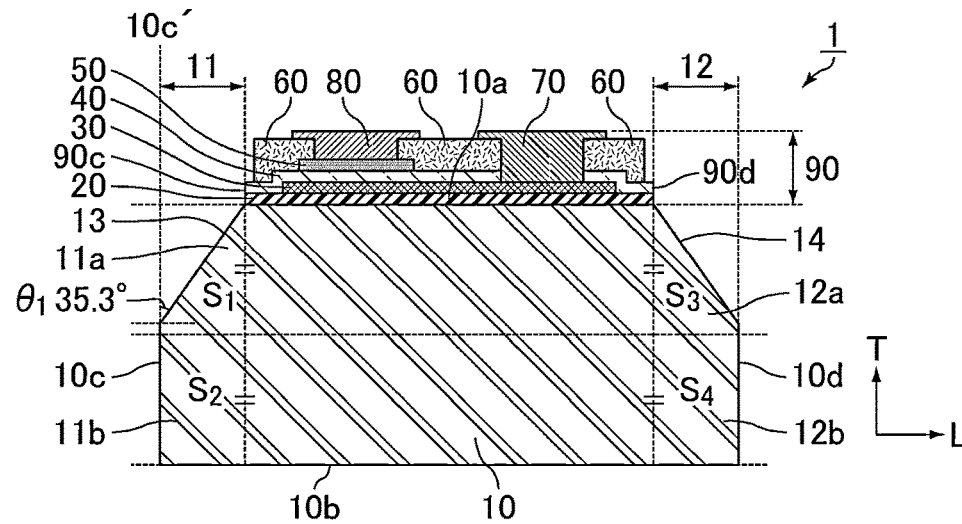
FIG. 3

A

B

C

A

B

C

A 90    90    90

150

B 90    116    90    116    90

150

C 3    90    3    90    3    90

13b    13b    13b 10c    10    10d    10c    10    10d    10c    10    10d

A

B

C

SEMICONDUCTOR DEVICE AND MODULE

CROSS REFERENCE TO RELATED APPLICATIONS

This application is a continuation of PCT Application No. PCT/JP2021/001713, filed Jan. 19, 2021, which claims priority to Japanese Patent Application No. 2020-006847, filed Jan. 20, 2020, the entire contents of each of which are hereby incorporated in their entirety.

TECHNICAL FIELD

The present disclosure relates to a semiconductor device and a module.

BACKGROUND

In general, for capacitor elements used for a semiconductor integrated circuit, a Metal Insulator Metal (MIM) capacitor has been widely known. The MIM capacitor is a capacitor having a parallel-plate type structure in which a dielectric is held between a lower electrode and an upper electrode.

For example, Japanese Unexamined Patent Application Publication No. 2008-252011 (hereinafter "Patent Document 1") discloses a dielectric capacitor having a substrate on which one electrode, a dielectric layer, and the other electrode are layered in this order. In the dielectric capacitor, a first insulating layer covering the other electrode has a first cavity through which a portion of the upper surface of the other electrode is exposed, and a second insulating layer covering the first insulating layer has a second cavity through which a portion of the upper surface of the other electrode is exposed. The second cavity has an opening dimension larger than the opening dimension of the first cavity, and a surface of a recess is covered with an electrically conductive hydrogen barrier layer.

Moreover, Japanese Unexamined Patent Application Publication No. 6-140275 (hereinafter "Patent Document 2") discloses a capacitance element formed by a first metal film disposed on a surface of a support substrate, a dielectric thin film formed on the first metal film and having a high permittivity, and a second metal film disposed on the dielectric thin film. In the capacitance element, an end portion of the second metal film is positioned apart from the first metal film of the dielectric thin film. In Patent Document 2, it is further disclosed that the support substrate has a step portion for preventing stress concentration from being caused during heat treatment.

However, when a voltage is applied after the dielectric capacitor described in Patent Document 1 has been mounted on a substrate and if the substrate is a conductor, there arises a problem that an electric field is produced between a land provided on the substrate and a base electrode. As a result, conductor loss is caused by the substrate itself imparting a resistance to the above-described electric field.

In addition, Patent Document 2 discloses that the support substrate has the step portion for preventing stress concentration from being caused during heat treatment. However, regarding the capacitance element described in Patent Document 2, the underside of the support substrate and the second metal film are not on the same plane, and there is thus difficulty in surface mounting.

SUMMARY OF THE INVENTION

Accordingly, the exemplary aspects of the present disclosure provide a semiconductor device and a module that enable reduction in conductor loss caused by the resistance of a semiconductor substrate.

In an exemplary aspect, a semiconductor device is provided that includes a semiconductor substrate having first and second main surfaces that face one another in a thickness direction, first and second end surfaces that face one another in a length direction orthogonal to the thickness direction, and first and second side surfaces that face one another in a width direction orthogonal to the thickness direction and the length direction. Moreover, the semiconductor device includes a circuit layer provided on the first main surface of the semiconductor substrate. The circuit layer has a first electrode layer provided on the semiconductor substrate side, a dielectric layer provided on the first electrode layer, a second electrode layer provided on the dielectric layer, a first outer electrode electrically connected to the first electrode layer and extended to a surface, of the circuit layer, on the opposite side to the semiconductor substrate, and a second outer electrode electrically connected to the second electrode layer and extended to a surface, of the circuit layer, on the opposite side to the semiconductor substrate. Moreover, the semiconductor substrate has a first end-portion region in which the circuit layer is not provided on the semiconductor substrate, on the side of the first end surface that is an end surface of the semiconductor substrate on the second outer electrode side in the length direction. In the first end-portion region, there is a first exposed portion that is a portion, other than the first main surface, of the semiconductor substrate exposed between the first main surface and the first end surface. In a section of the semiconductor substrate cut in parallel to the thickness direction and the length direction of the semiconductor substrate, when the first end-portion region is divided into two in the thickness direction by a division line dividing a portion, of the semiconductor substrate, having the first main surface on which the circuit layer is provided, into two, with the center in the thickness direction as a boundary, the area of a first region that is a region on the first main surface side is smaller than the area of a second region that is a region on the second main surface side.

In addition, according to an exemplary aspect, a module is provided that has the exemplary semiconductor device, a first land electrically connected to the first outer electrode, and a second land electrically connected to the second outer electrode and protruding outward farther than the circuit layer.

According to the present disclosure, a semiconductor device and a module are provided that enable reduction in conductor loss caused by the resistance of a semiconductor substrate.

BRIEF DESCRIPTION OF DRAWINGS

FIG. 1 is a schematic perspective view of an example of a semiconductor device of the present disclosure.

FIG. 2 is a sectional view taken along line A-A in FIG. 1.

FIG. 3 is a schematic sectional view of another example of the semiconductor device of the present disclosure.

DETAILED DESCRIPTION OF EMBODIMENTS

Figure 4:
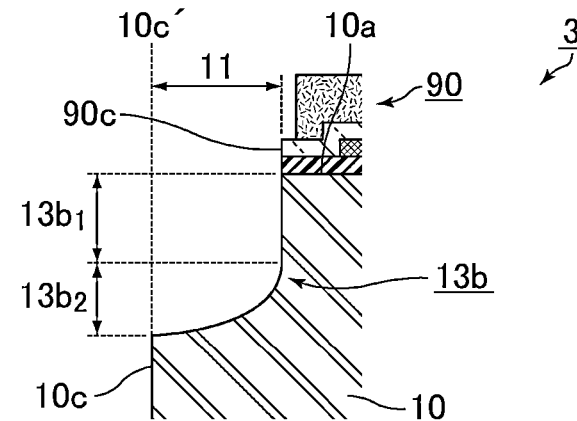
FIG. 4 is a schematic sectional view of another example of the semiconductor device of the present disclosure.

Hereinafter, exemplary embodiments of a semiconductor device and a module of the present disclosure will be described.

However, in general, it is noted that the present disclosure is not limited to the following configurations and can be appropriately modified to be applied without changing the spirit of the present disclosure. Moreover, the present disclosure also includes a combination of not less than two exemplary configurations described below.

[Semiconductor Device]

According to an exemplary aspect, a semiconductor device of the present disclosure includes a semiconductor substrate having first and second main surfaces that face one another in a thickness direction, first and second end surfaces that face one another in a length direction orthogonal to the thickness direction, and first and second side surfaces that face one another in a width direction orthogonal to the thickness direction and the length direction. Moreover, a circuit layer is provided on the first main surface of the semiconductor substrate. The circuit layer has a first electrode layer provided on the semiconductor substrate side, a dielectric layer provided on the first electrode layer, a second electrode layer provided on the dielectric layer, a first outer electrode electrically connected to the first electrode layer and extended to a surface, of the circuit layer, on the opposite side to the semiconductor substrate, and a second outer electrode electrically connected to the second electrode layer and extended to a surface, of the circuit layer, on the opposite side to the semiconductor substrate. The semiconductor substrate has a first end-portion region in which the circuit layer is not provided on the semiconductor substrate, on the side of the first end surface that is an end surface of the semiconductor substrate on the second outer electrode side in the length direction. In the first end-portion region, a first exposed portion is provided that is a portion, other than the first main surface, of the semiconductor substrate exposed between the first main surface and the first end surface. In a section of the semiconductor substrate cut in parallel to the thickness direction and the length direction of the semiconductor substrate, when the first end-portion region is divided into two in the thickness direction by a division line dividing a portion, of the semiconductor substrate, having the first main surface on which the circuit layer is provided, into two, with the center in the thickness direction as a boundary, the area of a first region that is a region on the first main surface side is smaller than the area of a second region that is a region on the second main surface side.

An example of the semiconductor device of the present disclosure will be described with reference to FIG. 1 and FIG. 2.

In particular, FIG. 1 is a schematic perspective view of an example of the semiconductor device of the present disclosure, and FIG. 2 is a sectional view taken along line A-A in FIG. 1.

As FIG. 1 generally illustrates, a semiconductor device 1 has a semiconductor substrate 10 and a circuit layer 90 disposed thereon.

The semiconductor substrate 10 has first and second main surfaces 10*a* and 10*b* that face one another in a thickness direction (e.g., T-direction), first and second end surfaces 10*c* and 10*d* that face one another in a length direction (e.g., L-direction) orthogonal to the thickness direction, and first and second side surfaces 10*e* and 10*f* that face one another in a width direction (e.g., W-direction) orthogonal to the thickness direction and the length direction.

Each of the first main surface 10*a*, the second main surface 10*b*, the first end surface 10*c*, the second end surface 10*d*, the first side surface 10*e*, and the second side surface 10*f* that form the semiconductor substrate 10 are not necessarily a smooth surface and may be an uneven surface in alternative aspects.

The first main surface 10*a* and the second main surface 10*b* that face one another in the thickness direction (e.g., the T-direction) can be substantially parallel to one another. Thus, the first main surface 10*a* and the second main surface 10*b* are not necessarily exactly orthogonal to the thickness direction.

In an exemplary aspect, the first end surface 10*c* and the second end surface 10*d* that face one another in the length direction (e.g., in the L-direction) can be substantially parallel to one another. Thus, the first end surface 10*c* and the second end surface 10*d* are not necessarily exactly orthogonal to the length direction.

Moreover, the first side surface 10*e* and the second side surface 10*f* that face one another in the width direction (e.g., in the W-direction) can be substantially parallel to one another. Thus, the first side surface 10*e* and the second side surface 10*f* are not necessarily exactly orthogonal to the width direction.

Accordingly, for the exemplary semiconductor substrate forming the semiconductor device of the present disclosure, the first and second main surfaces 10*a* and 10*b* are not necessarily exactly orthogonal to one another, and the same applies to the first and second end surfaces 10*c* and 10*d*, and to the first and second side surfaces 10*e* and 10*f*.

In the present description, a section of the semiconductor device 1 or the semiconductor substrate 10 parallel to the length direction (L-direction) and the thickness direction (T-direction) is referred to as a section LT. A section of the semiconductor device 1 or the semiconductor substrate 10 parallel to the width direction (W-direction) and the thickness direction (T-direction) is referred to as a section WT. A section of the semiconductor device 1 or the semiconductor substrate 10 parallel to the length direction (L-direction) and the width direction (W-direction) is referred to as a section LW.

The circuit layer 90 is provided on the first main surface 10*a* of the semiconductor substrate 10, and a first outer electrode 70 and a second outer electrode 80 are exposed at a surface of the circuit layer 90 on the opposite side to the semiconductor substrate 10 side.

As further shown, the first outer electrode 70 is provided on the second end surface 10d side of the semiconductor substrate 10, and the second outer electrode 80 is provided on the first end surface 10c side of the semiconductor substrate 10.

As FIG. 2 illustrates, an insulating layer 20 is provided on the first main surface 10a of the semiconductor substrate 10 forming the semiconductor device 1, and the circuit layer 90 is provided on the insulating layer 20. The circuit layer 90 has a first electrode layer 30 provided on the insulating layer 20, a dielectric layer 40 provided on the first electrode layer 30, a second electrode layer 50 provided on the dielectric layer 40, the first outer electrode 70 electrically connected to the first electrode layer 30 and extended to the surface, of the circuit layer 90, on the opposite side to the semiconductor substrate 10 side, and the second outer electrode 80 electrically connected to the second electrode layer 50 and extended to the surface, of the circuit layer 90, on the opposite side to the semiconductor substrate 10 side.

Moreover, a protective layer 60 is provided on a surface of the dielectric layer 40 and a portion of a surface of the second electrode layer 50.

The insulating layer 20 is provided between the first main surface 10a of the semiconductor substrate 10 and the first electrode layer 30.

It is also noted that, although the circuit layer 90 is provided on the entire first main surface 10a of the semiconductor substrate 10 in FIG. 2, there may be a region on the first main surface 10a on which the circuit layer 90 is not provided.

In addition, the semiconductor substrate 10 has a first end-portion region 11 and a second end-portion region 12 each in which the circuit layer 90 is not provided on the semiconductor substrate 10. The first end-portion region 11 is positioned on the side of the first end surface 10c that is an end surface of the semiconductor substrate 10 on the second outer electrode 80 side (e.g., the left side in FIG. 2), and the second end-portion region 12 is positioned on the side of the second end surface 10d that is an end surface of the semiconductor substrate 10 on the first outer electrode 70 side (e.g., the right side in FIG. 2).

The first end-portion region 11 refers to a region from an end portion 90c, on the first end surface 10c side, of the circuit layer 90 to the first end surface 10c of the semiconductor substrate 10. The second end-portion region 12 refers to a region from an end portion 90d, on the second end surface 10d side, of the circuit layer 90 to the second end surface 10d.

A first exposed portion 13 is provided in the first end-portion region 11. In this aspect, the first exposed portion 13 is a portion, other than the first main surface 10a, of the semiconductor substrate 10 exposed between the first main surface 10a and the first end surface 10c.

In the first end-portion region 11, when the first end-portion region 11 is divided into two in the thickness direction by a division line dividing a portion, of the semiconductor substrate 10, having the first main surface 10a on which the circuit layer 90 is provided, into two, with the center in the thickness direction as a boundary, an area $S_1$ of a first region 11a that is a region on the first main surface 10a side is smaller than an area $S_2$ of a second region 11b that is a region on the second main surface 10b side.

That is, the semiconductor substrate 10 has a shape formed by an edge portion that is present between the first main surface 10a and the first end surface 10c when the semiconductor substrate 10 is assumed to be a cuboid, being chamfered.

When a voltage is applied after the semiconductor device has been mounted on a land, electric lines of force generated due to a potential difference between the land electrically connected to the second electrode layer and the first electrode layer forming the circuit layer pass through the semiconductor substrate, and conductor loss due to the resistance of the semiconductor substrate is thereby caused. However, when the semiconductor substrate 10 has the above-described shape, the volume of a portion of the semiconductor substrate 10 through which such electric lines of force pass decreases, and conductor loss caused by the resistance of the semiconductor substrate is reduced.

Moreover, a second exposed portion 14 is provided in the second end-portion region 12. In this aspect, the second exposed portion 14 is a portion, other than the first main surface 10a, of the semiconductor substrate 10 exposed between the first main surface 10a and the second end surface 10d.

In the second end-portion region 12, when the second end-portion region 12 is divided into two in the thickness direction by a division line dividing a portion, of the semiconductor substrate 10, having the first main surface 10a on which the circuit layer 90 is provided, into two, with the center in the thickness direction as a boundary, an area $S_3$ of a third region 12a that is a region on the first main surface 10a side is smaller than an area $S_4$ of a fourth region 12b that is a region on the second main surface 10b side.

It is noted that, when the semiconductor device is mounted on a substrate, there is no potential difference between the first electrode layer and the land electrically connected to the first electrode layer. Thus, the second exposed portion 14 in FIG. 2 exhibits no effect of reducing conductor loss. Consequently, the second exposed portion is not necessarily provided in the second end-portion region. However, the second exposed portion is preferably provided in the second end-portion region in view of weight-balance adjustment of the semiconductor device or in view of manufacturing cost reduction. Moreover, it is preferable that the first exposed portion and the second exposed portion be shaped to be substantially linearly symmetrical.

As further shown in FIG. 2, the first exposed portion 13 has a slope shape in which a distance from a virtual extension line 10c' of the first end surface 10c to the first exposed portion 13 in the length direction linearly changes from the first main surface 10a toward the second main surface 10b.

Moreover, the second exposed portion 14 is shaped to be substantially linearly symmetrical with the first exposed portion 13 in the exemplary aspect.

In FIG. 2, the virtual extension line 10c' of the first end surface 10c and the first exposed portion 13 form an angle $\theta_1$ of 35.3°, for example.

Moreover, the angle $\theta_1$ between the virtual extension line 10c' of the first end surface 10c and the first exposed portion 13 is not particularly limited, but is preferably 4° or more and 36° or less according to an exemplary aspect.

The ratio of the maximum thickness of the first exposed portion 13 to the thickness of the semiconductor substrate 10 is preferably 30% or more and 70% or less.

When the ratio of the maximum thickness of the first exposed portion to the thickness of the semiconductor substrate is less than 30%, there may be a case where conductor loss cannot be reduced sufficiently. On the other hand, when the ratio of the maximum thickness of the first exposed portion to the thickness of the semiconductor substrate exceeds 70%, chipping, which is damage, on impact, to the semiconductor device, may be likely occur.

It is generally noted that the first exposed portion refers to a portion, other than the first main surface, of the semiconductor substrate exposed between the first main surface and the first end surface. In addition, the maximum thickness of the first exposed portion is the maximum height of the first exposed portion, when the semiconductor substrate is viewed from the first end surface, and is obtained by the height of the first end surface (the length in the height direction) being subtracted from the height of the semiconductor substrate when the semiconductor substrate is viewed from the first end surface side.

In the section LT of the semiconductor substrate, the maximum length of a distance from the virtual extension line of the first end surface to the first exposed portion in the length direction is preferably 5 μm or more and 20 μm or less.

Regarding the semiconductor device of the present disclosure, it is noted that the shape of the first exposed portion is not limited to the above-described shape. Other examples of the shape of the first exposed portion will be described with reference to FIG. 3, FIG. 4, and FIG. 5.

In particular, FIG. 3 is a schematic sectional view of another example of the semiconductor device of the present disclosure.

As shown, a semiconductor device 2 has a first end-portion region 11 in which a circuit layer 90 is not formed on a first main surface 10a of a semiconductor substrate 10. A first exposed portion 13a is formed in the first end-portion region 11.

In the semiconductor device 2, when the first exposed portion 13a is divided into two, in the thickness direction, at a portion at which the first exposed portion 13a has the maximum thickness, a change $\Delta d_1$ of a distance, in a region $13a_1$ on the first main surface 10a side, from a virtual extension line 10c' of the first end surface 10c to the first exposed portion 13a in the length direction is smaller than a change $\Delta d_2$ of a distance, in a region $13a_2$ on the second main surface 10b side, from the virtual extension line 10c' of the first end surface 10c to the first exposed portion 13a in the length direction.

FIG. 4 is a schematic sectional view of another example of the semiconductor device of the present disclosure.

As shown, a semiconductor device 3 has a first end-portion region 11 in which a circuit layer 90 is not formed on a semiconductor substrate 10. A first exposed portion 13b is formed in the first end-portion region 11.

Moreover, the semiconductor device 3 has a region $13b_1$ that is provided on the first main surface 10a side and in which a distance from a virtual extension line 10c' of the first end surface 10c to the first exposed portion 13b in the length direction does not change and a region $13b_2$ that is provided on the second main surface 10b side and in which a distance from the virtual extension line 10c' of the first end surface 10c to the first exposed portion 13b in the length direction changes.

Figure 5:
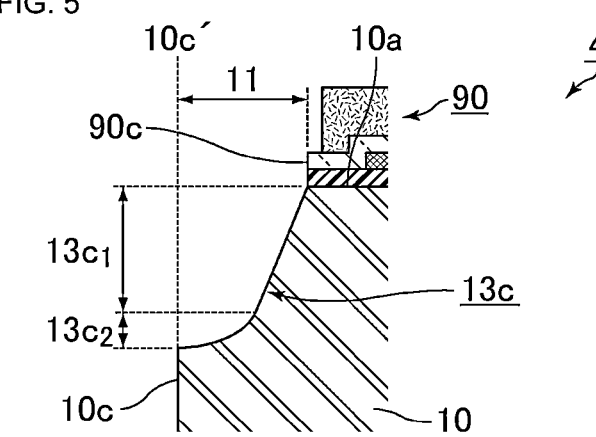
FIG. 5 is a schematic sectional view of another example of the semiconductor device of the present disclosure.

FIG. 5 is a schematic sectional view of another example of the semiconductor device of the present disclosure.

A semiconductor device 4 has a first end-portion region 11 in which a circuit layer 90 is not formed on a semiconductor substrate 10. A first exposed portion 13c is formed in the first end-portion region 11.

The semiconductor device 4 has a region $13c_1$ that is provided on the first main surface 10a side and in which a distance from a virtual extension line 10c' of the first end surface 10c to the first exposed portion 13c in the length direction linearly changes and a region $13c_2$ that is provided on the second main surface 10b side and in which a distance from the virtual extension line 10c' of the first end surface 10c to the first exposed portion 13c in the length direction nonlinearly changes from the first main surface 10a toward the second main surface 10b.

It is noted that although an example having no region in which the first exposed portion is not formed in the first end-portion region is described in each of FIGS. 1-5, the semiconductor device of the present disclosure may have a region in which no first exposed portion is formed in the first end-portion region.

In an example of the semiconductor device of the present disclosure, in the section LT, a distance from the virtual extension line of the first end surface of the semiconductor substrate to the first electrode layer in the length direction is preferably larger than a distance from the virtual extension line to the second electrode layer.

Figure 6:
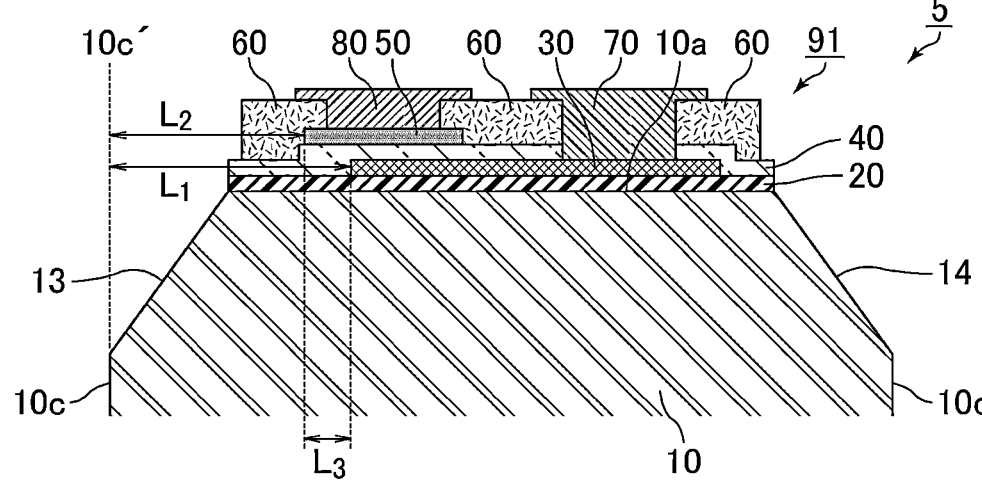
FIG. 6 is a schematic sectional view of an example of a circuit layer forming the semiconductor device of the present disclosure.

FIG. 6 is a schematic sectional view of an example of the circuit layer forming the semiconductor device of the present disclosure.

Regarding a semiconductor device 5 illustrated in FIG. 6, a distance $L_1$ from a virtual extension line 10c' of a first end surface 10c of a semiconductor substrate 10 to a first electrode layer 30 in the length direction is larger than a distance $L_2$ from the virtual extension line 10c' of the first end surface 10c to a second electrode layer 50 in the length direction.

In the case where $L_1$ is larger than $L_2$, when a voltage is applied after the semiconductor device 5 has been mounted on a substrate, the second electrode layer 50 is configured to block the electric lines of force generated between a conductor such as the land connected to the second outer electrode 80 and the first electrode layer 30, and it is thereby possible to suppress conductor loss.

Although not being particularly limited, a difference (e.g., distance $L_3$) between the distance $L_1$ and the distance $L_2$ is preferably 5 μm or more and 200 μm or less according to an exemplary aspect.

When the above-described distance $L_3$ is less than 5 μm, there may be a case where the second electrode layer cannot sufficiently block the electric lines of force generated from the first electrode layer toward a conductor such as the land connected to the second outer electrode. On the other hand, when the above-described distance $L_3$ exceeds 200 μm, a region in which the first electrode layer and the second electrode layer face one another is narrowed, and there may be a case where the semiconductor device cannot exhibit a desired electrostatic capacity.

In an embodiment of the semiconductor device of the present disclosure, the semiconductor substrate preferably has, on the first side surface side, a first side-portion region in which the circuit layer is not provided on the semiconductor substrate, and has, in the above-described first side-portion region, a third exposed portion that is a portion, other than the first main surface, of the semiconductor substrate exposed between the first main surface and the first side surface.

In the section WT, when the first side-portion region is divided into two in the thickness direction by a division line dividing a portion, of the semiconductor substrate, having the first main surface on which the circuit layer is provided, into two, with the center in the thickness direction as a boundary, the area of a fifth region that is a region on the first main surface side is preferably smaller than the area of a sixth region that is a region on the second main surface side.

In addition, in an embodiment of the semiconductor device of the present disclosure, the semiconductor substrate has, on the second side surface side, a second side-portion region in which the circuit layer is not provided on the semiconductor substrate, and has, in the above-described second side-portion region, a fourth exposed portion that is a portion, other than the first main surface, of the semiconductor substrate exposed between the first main surface and the second side surface.

In the section WT, when the second side-portion region is divided into two in the thickness direction by a division line dividing a portion, of the semiconductor substrate, having the first main surface on which the circuit layer is provided, into two, with the center in the thickness direction as a boundary, the area of a seventh region that is a region on the first main surface side is preferably smaller than the area of an eighth region that is a region on the second main surface side.

Moreover, it is preferable that the third exposed portion and the fourth exposed portion be shaped to be substantially linearly symmetrical according to the exemplary aspect.

Figure 7:
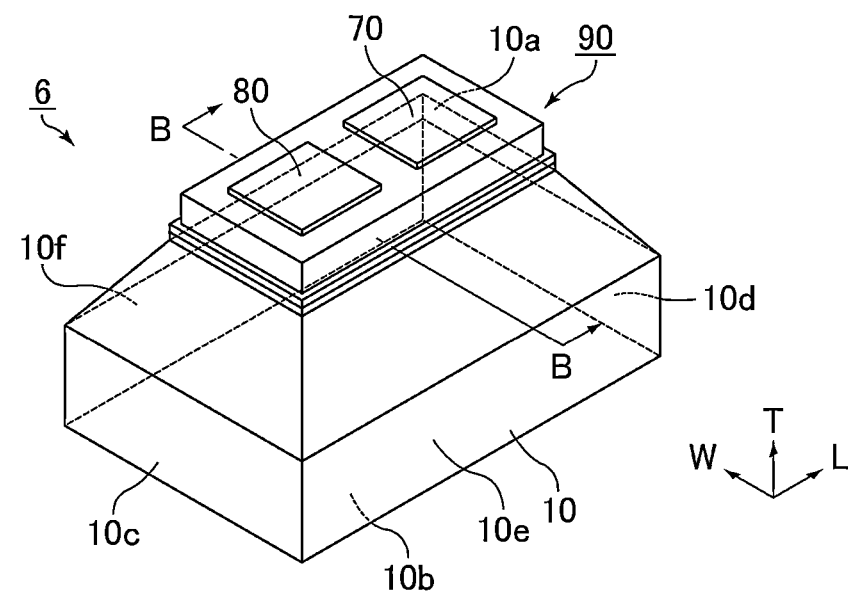
FIG. 7 is a schematic perspective view of another example of the semiconductor device of the present disclosure.
Figure 8:
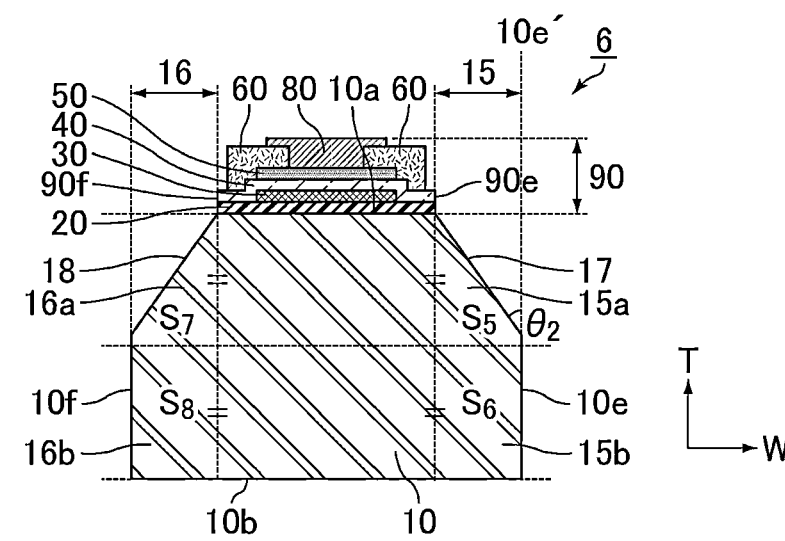
FIG. 8 is a sectional view taken along line B-B in FIG. 7.

FIG. 7 is a schematic perspective view of another example of the semiconductor device of the present disclosure, and FIG. 8 is a sectional view taken along line B-B in FIG. 7.

As FIG. 7 and FIG. 8 illustrate, a semiconductor substrate 10 forming a semiconductor device 6 has a first side-portion region 15 and a second side-portion region 16 each in which a circuit layer 90 is not provided on the semiconductor substrate 10. In the semiconductor substrate 10, the first side-portion region 15 is positioned on the first side surface 10e side, and the second side-portion region 16 is positioned on the second side surface 10f side.

The first side-portion region 15 refers to a region from an end portion 90e, on the first side surface 10e side, of the circuit layer 90 to the first side surface 10e of the semiconductor substrate 10. In addition, the second side-portion region 16 refers to a region from an end portion 90f, on the second side surface 10f side, of the circuit layer 90 to the second side surface 10f.

A third exposed portion 17 is provided in the first side-portion region 15.

The third exposed portion 17 is a portion, other than the first main surface 10a, of the semiconductor substrate 10 exposed between the first main surface 10a and the first side surface 10e.

In the first side-portion region 15, when the first side-portion region 15 is divided into two in the thickness direction by a division line dividing a portion, of the semiconductor substrate 10, having the first main surface 10a on which the circuit layer 90 is provided, into two, with the center in the thickness direction as a boundary, an area $S_5$ of a fifth region 15a that is a region on the first main surface 10a side is smaller than an area $S_6$ of a sixth region 15b that is a region on the second main surface 10b side.

That is, the semiconductor substrate 10 has a shape formed by an edge portion that is present between the first main surface 10a and the first side surface 10e when the semiconductor substrate 10 is assumed to be a cuboid that is chamfered.

A fourth exposed portion 18 is provided in the second side-portion region 16. In the exemplary aspect, the fourth exposed portion 18 is a portion, other than the first main surface 10a, of the semiconductor substrate 10 exposed between the first main surface 10a and the second side surface 10f. Moreover, the fourth exposed portion 18 is shaped to be substantially linearly symmetrical with the third exposed portion 17 in the exemplary aspect.

In the second side-portion region 16, when the second side-portion region 16 is divided into two in the thickness direction by a division line dividing a portion, of the semiconductor substrate 10, having the first main surface 10a on which the circuit layer 90 is provided, into two, with the center in the thickness direction as a boundary, an area $S_7$ of a seventh region 16a that is a region on the first main surface 10a side is smaller than an area $S_8$ of an eighth region 16b that is a region on the second main surface 10b side.

That is, the semiconductor substrate 10 has a shape formed by an edge portion that is present between the first main surface 10a and the second side surface 10f when the semiconductor substrate 10 is assumed to be a cuboid that is chamfered.

When a voltage is applied after the semiconductor device 6 has been mounted on a land, electric lines of force generated due to a potential difference between the land that is a land electrically connected to the second electrode layer 50 and the first electrode layer 30 forming the circuit layer 90 pass through the semiconductor substrate 10, and conductor loss due to the resistance of the semiconductor substrate is thereby caused. However, when the semiconductor substrate 10 has the above-described shape and configuration, the volume of a portion of the semiconductor substrate 10 through which such electric lines of force pass decreases, and conductor loss caused by the resistance of the semiconductor substrate 10 is reduced.

It is noted that in FIG. 7, when the semiconductor substrate 10 is assumed to be a cuboid, the third exposed portion 17 is provided in an entire edge portion between the first side surface 10e and the first main surface 10a of the semiconductor substrate 10, and the fourth exposed portion 18 is provided in an entire edge portion between the second side surface 10f and the first main surface 10a of the semiconductor substrate 10. Here, at positions apart from the land connected to the second outer electrode 80, that is, for example, in the vicinity of the first outer electrode 70, the third exposed portion 17 and the fourth exposed portion 18 are not necessarily provided because an electric line of force, which may cause conductor loss, is generated between the land connected to the second outer electrode 80 and the first electrode layer 30.

According to an exemplary aspect, an angle $\theta_2$ between a virtual extension line 10e' of the first side surface 10e and the third exposed portion 17 is not particularly limited, but is preferably 4° or more and 36° or less, for example.

Hereinafter, each constituent forming the semiconductor device of the present disclosure will be described.

Examples of a material for the semiconductor substrate include silicon.

Moreover, the electric resistivity of the semiconductor substrate is preferably $10^{-5}$ Ωcm or more and $10^5$ Ωcm or less. for example.

In general, it is noted that the external dimensions of the semiconductor substrate are not particularly limited. However, the length is preferably 200 μm or more and 600 μm or less, the thickness is preferably 50 μm or more and 100 μm or less, and the width is preferably 100 μm or more and 300 μm or less, according to exemplary aspect.

Examples of a material for the first electrode layer include metals such as Cu, Ag, Au, Al, Ni, Cr, and Ti and a conductor containing a metal of the above-described metal examples.

In addition, the first electrode layer may have two or more conductor layers made of corresponding ones of the above-described materials.

Although not being particularly limited, the thickness of the first electrode layer is preferably 0.3 μm or more and 10 μm or less, more preferably 0.5 μm or more and 3 μm or less according to an exemplary aspect.

Examples of a material for the dielectric layer include materials having dielectric properties or insulation properties that are, for example, oxides such as $SiO_2$, $Al_2O_3$, $HfO_2$, $Ta_2O_5$, and $ZrO_2$ and nitrides such as $Si_3N_4$.

Although not being particularly limited, the thickness of the dielectric layer is preferably 0.02 μm or more and 2 μm or less according to an exemplary aspect.

For the second electrode layer, a material similar to the material for the first electrode layer can preferably be used in an exemplary aspect.

Although not being particularly limited, the thickness of the second electrode layer is preferably 0.3 μm or more and 10 μm or less, more preferably 0.5 μm or more and 5 μm or less, for example.

Examples of a material for the first outer electrode and the second outer electrode include Cu and Al.

Moreover, a plating layer may be formed on the outermost surfaces of the first outer electrode and the second outer electrode. Examples of such a plating layer include an Au plating layer and a Sn plating layer. It is also noted that the material for the first outer electrode and the material for the second outer electrode may be the same as or different from one another in exemplary aspects.

The semiconductor device of the present disclosure may have an insulating layer between the first main surface of the semiconductor substrate and the first electrode layer.

When such an insulating layer is provided between the first main surface and the first electrode layer of the semiconductor substrate, a current can be suppressed from flowing from the first electrode layer to the semiconductor substrate.

A material for the insulating layer preferably has electric insulation properties higher than those of the semiconductor substrate, and examples of a material for the insulating layer include oxides such as $SiO_2$, $Al_2O_3$, $HfO_2$, $Ta_2O_5$, and $ZrO_2$ and nitrides such as $Si_3N_4$.

Although not being particularly limited, the thickness of the insulating layer is preferably 0.5 μm or more and 3 μm or less.

In the semiconductor device of the present disclosure, a protective layer that protects the dielectric layer and/or the second electrode layer from moisture can be formed on the dielectric layer and on a portion of the second electrode layer. Examples of a material for the protective layer include $SiO_2$ and $Si_3N_4$.

Although not being particularly limited, the thickness of the protective layer is preferably 0.5 μm or more and 5 μm or less, for example.

Moreover, The thickness of the entire circuit layer is preferably 5 μm or more and 30 μm or less, for example.

[Method of Manufacturing Semiconductor Device]

Examples of a method of manufacturing the semiconductor device of the present disclosure include a method in which, regarding a semiconductor device having a circuit layer provided on a first main surface of a semiconductor substrate, an edge portion between the first main surface of the semiconductor substrate and an end surface, in the length direction, of the semiconductor substrate on the second outer electrode side (the first end surface in the semiconductor device of the present disclosure) is chamfered. At this point, a portion of the circuit layer, which is formed on the first main surface, and the insulating layer, which is disposed on the semiconductor substrate side of the dielectric layer, can be removed within the range in which the functions of the semiconductor device are not impaired.

On the other hand, examples of a method of manufacturing, at once, a large quantity of the semiconductor devices of the present disclosure include a method in which, after a circuit layer is formed on a surface of a semiconductor wafer (a surface serving as the first main surface) by, for example, photolithography, the semiconductor wafer is cut into individual semiconductor devices with a dicer.

Figure 9:
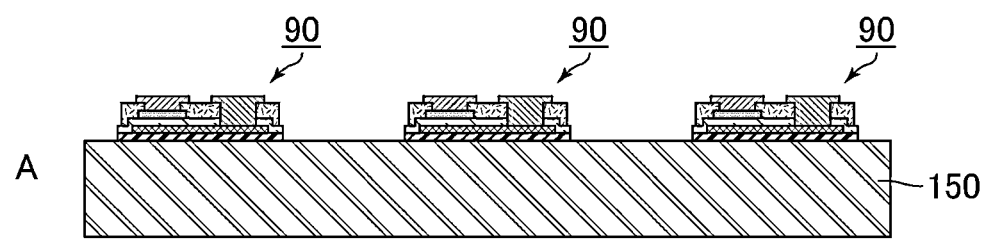
FIG. 9 includes Steps A, B and C that are schematic process drawings of an example of a method of manufacturing the semiconductor device of the present disclosure.
Figure 9:
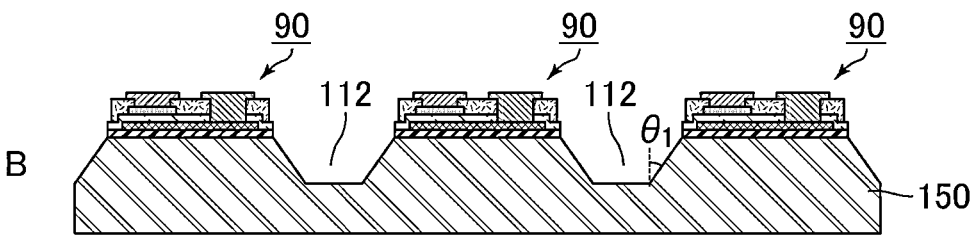
Figure 9:
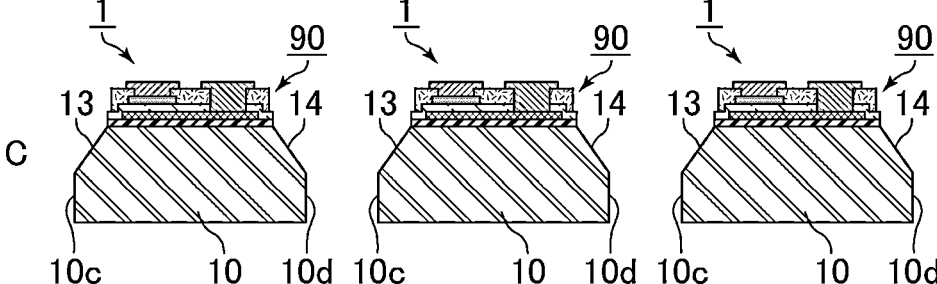

FIG. 9 includes Steps A to C that are schematic process drawings of an example of a method of manufacturing the semiconductor device of the present disclosure.

As FIG. 9 illustrates, first at Step A, plural regions serving as the circuit layers 90 are formed on a surface of a semiconductor wafer 150.

Subsequently, at Step B, a region of the semiconductor wafer 150 on which the circuit layer 90 is not formed is anisotropically etched. By such anisotropic etching being performed, a groove 112 is formed in the region of the semiconductor wafer 150 on which the circuit layer 90 is not formed. The groove 112 formed by anisotropic etching is inclined at a predetermined angle relative to the surface of the semiconductor wafer 150 (the surface serving as the first main surface).

Lastly, at Step C of FIG. 9, at the groove 112 formed by anisotropic etching, the semiconductor wafer 150 is cut, with a dicer or other machines, into the individual semiconductor devices 1. The groove 112 formed by anisotropic etching serves as each of the first exposed portion 13 and the second exposed portion 14 in the semiconductor device 1. In addition, surfaces of the semiconductor wafer 150 that are exposed by the semiconductor wafer 150 being cut with a dicer serve as the first end surface 10c and the second end surface 10d of the semiconductor substrate 10.

Regarding a method of anisotropic etching, when the material of the semiconductor wafer is Si and if a surface on which the circuit layer is formed is a Si (100) plane, there may be given, as an example, a method of performing immersion in an alkali solution such as NaOH.

By the semiconductor substrate being immersed in an alkali solution, the Si (100) plane is etched to form a groove extending along a Si (111) plane. The Si (111) plane is inclined at an angle of 54.7° relative to the Si (100) plane. Thus, an angle $\theta_1$ between the groove formed by anisotropic etching and the virtual extension line of the first end surface 10c is 35.3°.

Figure 10:
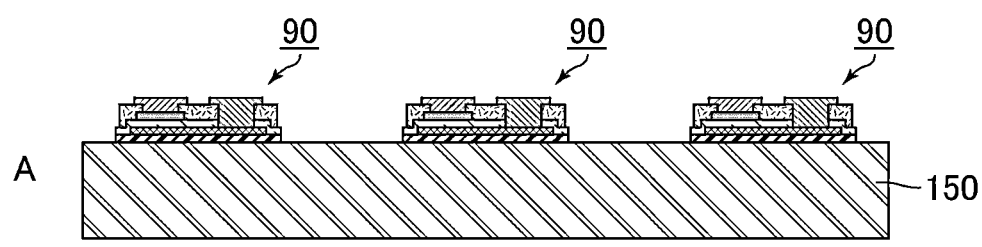
FIG. 10 includes Steps A, B and C that are schematic process drawings of another example of the method of manufacturing the semiconductor device of the present disclosure.
Figure 10:
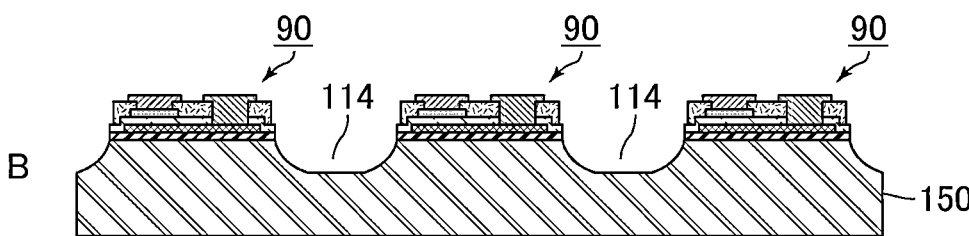
Figure 10:
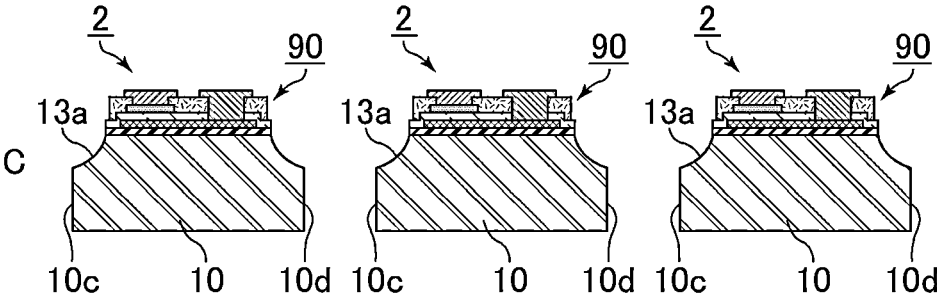

FIG. 10 includes Steps A to C that are schematic process drawings of another example of the method of manufacturing the semiconductor device of the present disclosure.

As FIG. 10 illustrates, first at Step A, plural regions serving as the circuit layers 90 are formed on a surface of a semiconductor wafer 150.

Subsequently, at Step B, a region of the semiconductor wafer 150 on which the circuit layer 90 is not formed is isotropically etched. By such isotropic etching being performed, a groove 114 is formed in the region of the semiconductor wafer 150 on which the circuit layer 90 is not formed.

Lastly, at Step C of FIG. 10, at the groove 114 formed by isotropic etching, the semiconductor wafer 150 is cut, with a dicer or other machines, into the individual semiconductor devices 2.

The groove 114 formed by isotropic etching serves as the first exposed portion 13a in the semiconductor device 2. In addition, surfaces of the semiconductor wafer 150 that are exposed by the semiconductor wafer 150 being cut with a dicer serve as the first end surface 10c and the second end surface 10d of the semiconductor substrate 10.

Isotropy etching can be performed by using a mixed acid containing, for example, hydrofluoric acid and nitric acid.

Figure 11:
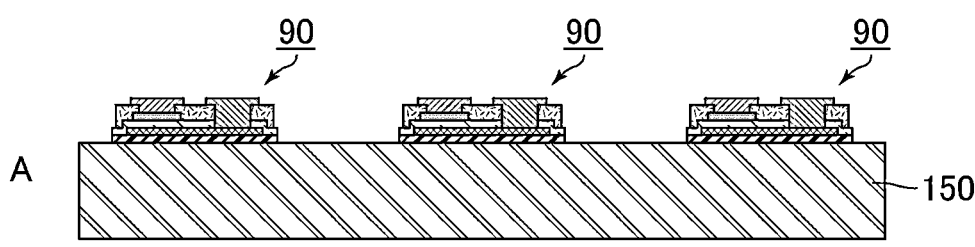
FIG. 11 includes Steps A, B and C that are schematic process drawings of another example of the method of manufacturing the semiconductor device of the present disclosure.
Figure 11:
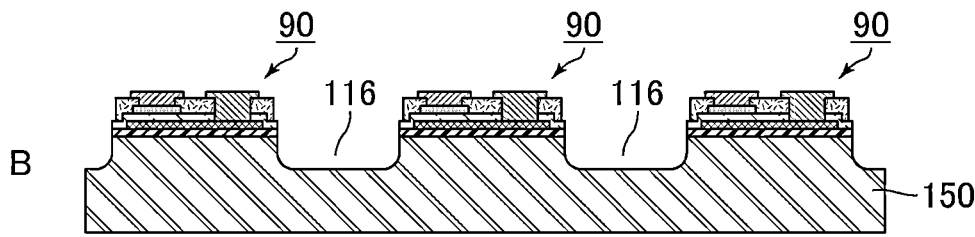
Figure 11:
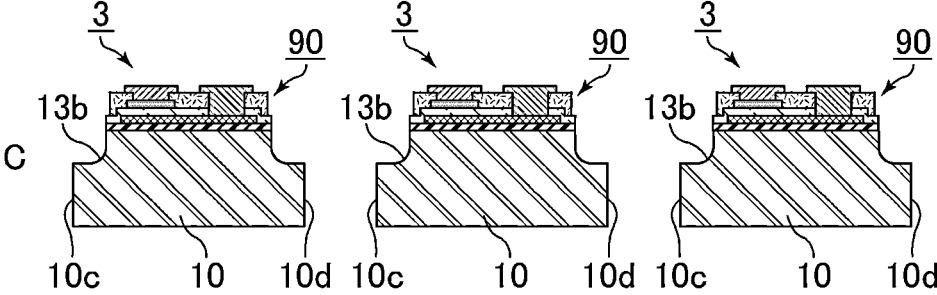

FIG. 11 includes Steps A to C that are schematic process drawings of another example of the method of manufacturing the semiconductor device of the present disclosure.

As FIG. 11 illustrates, first at Step A, plural regions serving as the circuit layers 90 are formed on a surface of a semiconductor wafer 150.

Subsequently, at Step B, a region of the semiconductor wafer 150 on which the circuit layer 90 is not formed is subjected to the first dicing, with a blade, to a depth of 30% to 70% of the thickness of the semiconductor wafer 150 to form a groove 116.

Lastly, in Step C of FIG. 11, the second dicing is performed with a blade having a width narrower than the width of the blade used for the first dicing, and it is thereby possible to obtain the divided individual semiconductor devices 3.

The groove formed by the first dicing serves as the first exposed portion 13b in the semiconductor device 3. In addition, surfaces of the semiconductor wafer 150 that are exposed by the second dicing serve as the first end surface 10c and the second end surface 10d of the semiconductor substrate 10.

Figure 12:
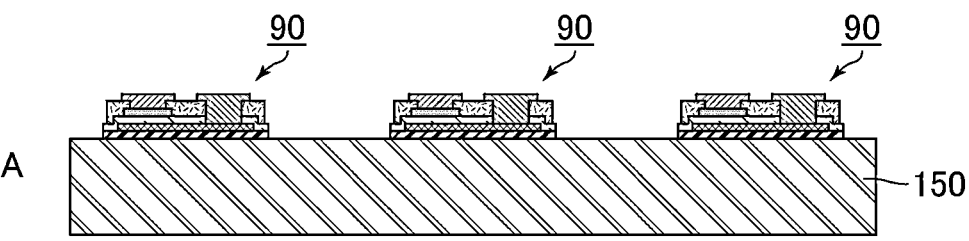
FIG. 12 includes Steps A, B and C that are schematic process drawings of another example of the method of manufacturing the semiconductor device of the present disclosure.
Figure 12:
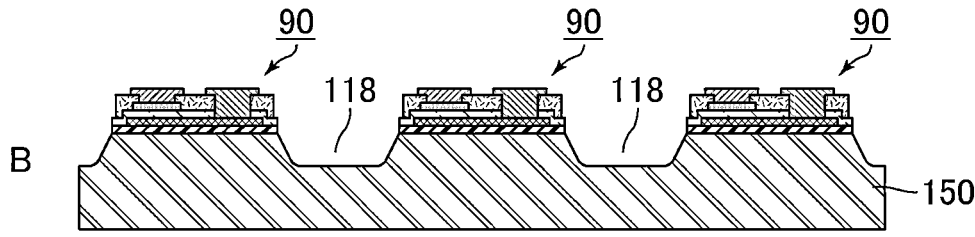
Figure 12:
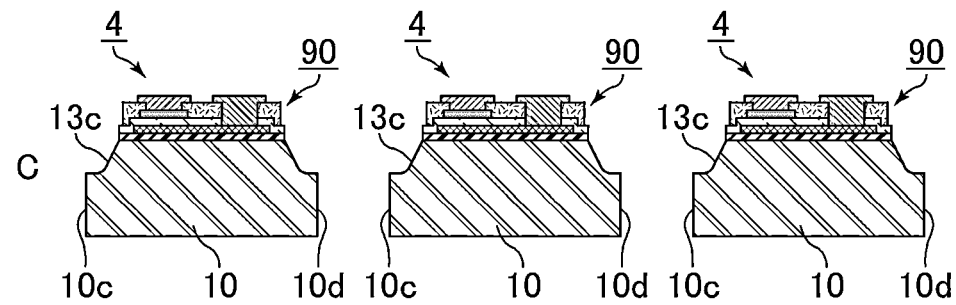

FIG. 12 includes Steps A to C that are schematic process drawings of another example of the method of manufacturing the semiconductor device of the present disclosure.

As FIG. 12 illustrates, first at Step A, plural regions serving as the circuit layers 90 are formed on a surface of a semiconductor wafer 150.

Subsequently, at Step B, a region of the semiconductor wafer 150 on which the circuit layer 90 is not formed is subjected to the first dicing, with a blade, to a depth of 30% to 70% of the thickness of the semiconductor wafer 150 to form a tapered-shape groove 118. The tapered-shape groove 118 can be formed by dicing that is performed with a tapered-shape blade such as a bevel blade or with two blades arranged to form a V shape, for example.

Lastly, at Step C of FIG. 12, the second dicing is performed with a blade having a width narrower than the width of the blade used for the first dicing, and it is thereby possible to obtain the divided individual semiconductor devices 4.

The groove formed by the first dicing serves as the first exposed portion 13c in the semiconductor device 4. In addition, surfaces of the semiconductor substrate 10 that are exposed by the second dicing serve as the first end surface 10c and the second end surface 10d of the semiconductor substrate 10.

[Exemplary Module]

An exemplary module of the present disclosure has the semiconductor device described above, a first land electrically connected to the first outer electrode, and a second land electrically connected to the second outer electrode and protruding outward farther than the circuit layer.

Because the module of the present disclosure has the semiconductor device of the present disclosure, the volume of a portion of the semiconductor substrate through which electric lines of force generated from the first electrode layer toward the second land pass is reduced even when the second land electrically connected to the second outer electrode protrudes outward farther than the circuit layer, and it is thereby possible to reduce conductor loss caused by the resistance of the semiconductor substrate.

Figure 13:
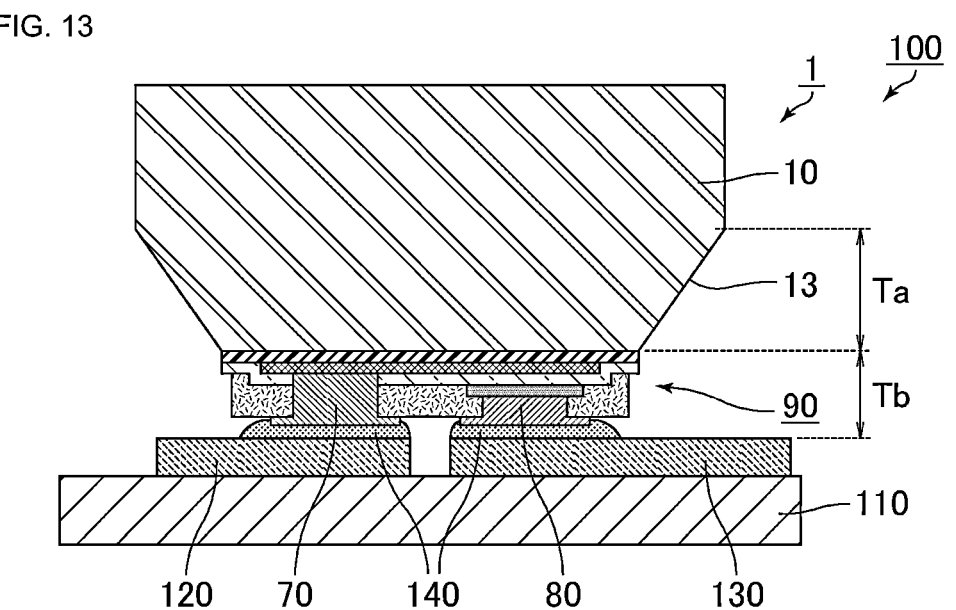
FIG. 13 is a schematic sectional view of an example of a module of the present disclosure.

FIG. 13 is a schematic sectional view of an example of the module of the present disclosure.

As FIG. 13 illustrates, a module 100 has the semiconductor device 1, a first land 120 electrically connected to the first outer electrode 70 of the semiconductor device 1, and a second land 130 electrically connected to the second outer electrode 80 of the semiconductor device 1. By using a solder 140, the first outer electrode 70 and the first land 120 are connected to one another, and the second outer electrode 80 and the second land 130 are connected to one another.

The second land 130 protrudes outward farther than the circuit layer 90.

Moreover, the first land 120 and the second land 130 are each fixed on a substrate 110 in an exemplary aspect.

In an exemplary aspect, the total of the maximum thickness Ta of the first exposed portion 13 and the shortest distance Tb from the semiconductor substrate 10 to the second land 130 is preferably 35 μm or more and 235 μm or less.

Moreover, the longer the shortest distance Tb from the semiconductor substrate 10 to the second land 130 is, the weaker the electric lines of force generated between the semiconductor substrate 10 and the second land 130 become. As a result, the maximum thickness Ta of the first exposed portion 13 can be reduced. When the total of the maximum thickness Ta of the first exposed portion 13 and the shortest distance Tb from the semiconductor substrate 10 to the second land 130 is 35 μm or more and 235 μm or less, an effect of reducing conductor loss can surely be exhibited.

The maximum thickness Ta of the first exposed portion 13 is preferably 15 μm or more and 175 μm or less, for example.

Moreover, the shortest distance Tb from the semiconductor substrate 10 to the second land 130 is preferably 20 μm or more and 60 μm or less, for example.

Regarding the module of the present disclosure, an alternating current is preferably applied between the first land and the second land. When an alternating current is applied between the first land and the second land, conductor loss is repeatedly generated between the land connected to the second outer electrode and the first electrode layer every time the current direction changes. For such a matter, the conductor loss can be reduced particularly in the case where an alternating current is applied because the module of the present disclosure enables reduction in the conductor loss generated every time the current direction changes.

Examples of a material for the first land and the second land include copper and gold.

In the module of the present disclosure, a mold resin such as an epoxy resin is preferably disposed between the second land and the semiconductor substrate.

Because the mold resin has a relative permittivity higher than the relative permittivity of air, the conductor loss generated between the second land and the semiconductor device is increased when the mold resin is disposed between the second land and the semiconductor substrate. With the module of the present disclosure, conductor loss can be suppressed, and it is thereby possible to suppress conductor loss from being increased even when the mold resin is disposed between the second land and the semiconductor substrate.

REFERENCE SIGNS LIST 1, 2, 3, 4, 5, 6 semiconductor device
10 semiconductor substrate
10a first main surface
10b second main surface
10c first end surface
10c' virtual extension line of first end surface
10d second end surface
10e first side surface
10e' virtual extension line of first side surface 10*f* second side surface
11 first end-portion region
11*a* first region
11*b* second region
12 second end-portion region
12*a* third region
12*b* fourth region
13, 13*a*, 13*b*, 13*c* first exposed portion
13*a*$_1$ region on the first main surface side when first exposed portion is divided into two in the thickness direction
13*a*$_2$ region on the second main surface side when first exposed portion is divided into two in the thickness direction
13*b*$_1$ region in which distance from virtual extension line to first exposed portion in the length direction does not change
13*b*$_2$ region in which distance from virtual extension line to first exposed portion in the length direction changes
13*c*$_1$ region in which distance from virtual extension line to first exposed portion in the length direction linearly changes
13*c*$_2$ region in which distance from virtual extension line to first exposed portion in the length direction nonlinearly changes
14 second exposed portion
15 first side-portion region
15*a* fifth region
15*b* sixth region
16 second side-portion region
16*a* seventh region
16*b* eighth region
17 third exposed portion
18 fourth exposed portion
20 insulating layer
30 first electrode layer
40 dielectric layer
50 second electrode layer
60 protective layer
70 first outer electrode
80 second outer electrode
90 circuit layer
90*c* end portion of circuit layer on the first end surface side
90*d* end portion of circuit layer on the second end surface side
90*e* end portion of circuit layer on the first side surface side
90*f* end portion of circuit layer on the second side surface side
100 module
110 substrate
112 groove formed by anisotropic etching
114 groove formed by isotropic etching
116, 118 groove formed with blade
120 first land
130 second land
140 solder
150 semiconductor wafer
S$_1$ area of first region
S$_2$ area of second region
S$_3$ area of third region
S$_4$ area of fourth region
S$_5$ area of fifth region
S$_6$ area of sixth region
S$_7$ area of seventh region
S$_8$ area of eighth region Ta maximum thickness of first exposed portion
Tb shortest distance from semiconductor substrate to second land
$\theta_1$ angle between virtual extension line of first end surface and first exposed portion
$\theta_2$ angle between virtual extension line of first side surface and third exposed portion
$\Delta d_1$, $\Delta d_2$ change of distance from virtual extension line to first exposed portion in the length direction

The invention claimed is:

1. A semiconductor device comprising:
a semiconductor substrate having first and second main surfaces that face each other in a thickness direction, first and second end surfaces that face each other in a length direction orthogonal to the thickness direction, and first and second side surfaces that face each other in a width direction orthogonal to the thickness direction and the length direction; and
a circuit layer disposed on the first main surface of the semiconductor substrate and including:
   a first electrode layer disposed above the first main surface of the semiconductor substrate,
   a dielectric layer disposed on the first electrode layer,
   a second electrode layer disposed on the dielectric layer,
   a first outer electrode electrically connected to the first electrode layer and extending away from the first main surface of the semiconductor substrate in the thickness direction, and
   a second outer electrode electrically connected to the second electrode layer and extending away from the first main surface of the semiconductor substrate in the thickness direction,
wherein the semiconductor substrate is a continuous material that includes a first end-portion region where the circuit layer is not disposed on the semiconductor substrate and on a side of the first end surface that is an end surface of the semiconductor substrate on a second outer electrode side in the length direction,
wherein, in the first end-portion region, a first exposed portion is disposed that is exposed between the first main surface and the first end surface, and
wherein, in a section of the semiconductor substrate cut in parallel to the thickness direction and the length direction of the semiconductor substrate, when the first end-portion region is divided into two in the thickness direction by a division line dividing a portion of the semiconductor substrate having the first main surface on which the circuit layer is provided with a center in the thickness direction as a boundary, an area of a first region that is a region on a first main surface side is smaller than an area of a second region that is a region on a second main surface side.

2. The semiconductor device according to claim 1, wherein, in a section of the semiconductor substrate cut in parallel to the thickness direction and the length direction, the first exposed portion has a slope shape in which a distance from a virtual extension line of the first end surface to the first exposed portion in the length direction linearly changes from the first main surface toward the second main surface.

3. The semiconductor device according to claim 2, wherein, in a section of the semiconductor substrate cut in parallel to the thickness direction and the length direction, an angle between a virtual extension line of the first end surface and the first exposed portion is 4° or more and 36° or less.

4. The semiconductor device according to claim 1, wherein, in a section of the semiconductor substrate cut in parallel to the thickness direction and the length direction, the first exposed portion has a shape in which a distance from a virtual extension line of the first end surface to the first exposed portion in the length direction nonlinearly changes from the first main surface toward the second main surface.

5. The semiconductor device according to claim 4, wherein, when the first exposed portion is divided into two in the thickness direction at a portion at which the first exposed portion has a maximum thickness, a change of a distance, in a region on the first main surface side, from a virtual extension line of the first end surface to the first exposed portion in the length direction is smaller than a change of a distance, in a region on the second main surface side, from a virtual extension line of the first end surface to the first exposed portion in the length direction.

6. The semiconductor device according to claim 1, wherein, in a section of the semiconductor substrate cut in parallel to the thickness direction and the length direction, the first exposed portion has a shape having a region that is disposed on the first main surface side and in which a distance from a virtual extension line of the first end surface to the first exposed portion in the length direction does not change and a region that is disposed on the second main surface side and in which a distance from a virtual extension line of the first end surface to the first exposed portion in the length direction changes.

7. The semiconductor device according to claim 1, wherein, in a section of the semiconductor substrate cut in parallel to the thickness direction and the length direction, the first exposed portion has a shape having a region that is disposed on the first main surface side and in which a distance from a virtual extension line of the first end surface to the first exposed portion in the length direction linearly changes and a region that is disposed on the second main surface side and in which a distance from a virtual extension line of the first end surface to the first exposed portion in the length direction nonlinearly changes.

8. The semiconductor device according to claim 1, wherein, in a section of the semiconductor substrate cut in parallel to the thickness direction and the length direction, a ratio of a maximum thickness of the first exposed portion to a thickness of the semiconductor substrate is 30% or more and 70% or less.

9. The semiconductor device according to claim 1, wherein, in a section of the semiconductor substrate cut in parallel to the thickness direction and the length direction, a maximum length of a distance from a virtual extension line of the first end surface to the first exposed portion in the length direction is 5 μm or more and 20 μm or less.

10. The semiconductor device according to claim 1, wherein the semiconductor substrate has a second end-portion region in which the circuit layer is not provided on the first main surface and on a side of the second end surface that is an end surface of the semiconductor substrate on a first outer electrode side in the length direction, and wherein, in the second end-portion region, a second exposed portion is disposed that is exposed between the first main surface and the second end surface.

11. The semiconductor device according to claim 10, wherein, in a section of the semiconductor substrate cut in parallel to the thickness direction and the length direction, when the second end-portion region is divided into two in the thickness direction by a division line dividing a portion of the semiconductor substrate having the first main surface on which the circuit layer is provided with the center in the thickness direction as a boundary, an area of a third region that is a region on the first main surface side is smaller than an area of a fourth region that is a region on the second main surface side.

12. The semiconductor device according to claim 11, wherein, in a section of the semiconductor substrate cut in parallel to the thickness direction and the length direction, the first exposed portion and the second exposed portion each comprise a substantially linearly symmetrical shape to one another.

13. The semiconductor device according to claim 1,
wherein the semiconductor substrate has, on a first side surface side, a first side-portion region in which the circuit layer is not provided on the first main surface,
wherein, in the first side-portion region, a third exposed portion is disposed that is exposed between the first main surface and the first side surface, and
wherein, in a section of the semiconductor substrate cut in parallel to the thickness direction and the width direction, when the first side-portion region is divided into two in the thickness direction by a division line dividing a portion of the semiconductor substrate having the first main surface on which the circuit layer is provided with the center in the thickness direction as a boundary, an area of a fifth region that is a region on the first main surface side is smaller than an area of a sixth region that is a region on the second main surface side.

14. The semiconductor device according to claim 13,
wherein the semiconductor substrate has, on a second side surface side, a second side-portion region in which the circuit layer is not disposed on the first main surface,
wherein, in the second side-portion region, a fourth exposed portion is disposed that is exposed between the first main surface and the second side surface, and
wherein, in a section of the semiconductor substrate cut in parallel to the thickness direction and the width direction of the semiconductor substrate, when the second side-portion region is divided into two in the thickness direction by a division line dividing a portion of the semiconductor substrate having the first main surface on which the circuit layer is provided with the center in the thickness direction as a boundary, an area of a seventh region that is a region on the first main surface side is smaller than an area of an eighth region that is a region on the second main surface side.

15. The semiconductor device according to claim 14, wherein, in a section of the semiconductor substrate cut in parallel to the thickness direction and the width direction, the third exposed portion and the fourth exposed portion each comprise a substantially linearly symmetrical shape to one another.

16. The semiconductor device according to claim 1, further comprising an insulating layer disposed between the first main surface of the semiconductor substrate and the circuit layer, wherein the insulating layer does not extend on the first exposed portion, such that the first exposed portion is not covered.

17. A module comprising:
the semiconductor device according to claim 1;
a first land electrically connected to the first outer electrode; and
a second land electrically connected to the second outer electrode and that protrudes outward farther than the circuit layer.

18. The module according to claim 17, wherein an alternating current is configured to be applied between the first land and the second land.

19. The module according to claim 17, further comprising a mold resin that is disposed between the second land and the semiconductor substrate.

20. The module according to claim 17, wherein a total of a maximum thickness of the first exposed portion and a shortest distance from the semiconductor substrate to the second land is 35 μm or more and 235 μm or less.

* * * * *